(12) United States Patent
Inoue et al.

(10) Patent No.: US 9,132,494 B2
(45) Date of Patent: Sep. 15, 2015

(54) WIRING BOARD AND METHOD FOR MANUFACTURING THE SAME

(75) Inventors: Masahiro Inoue, Konan (JP); Hajime Saiki, Konan (JP); Atsuhiko Sugimoto, Kagamigahara (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 181 days.

(21) Appl. No.: 13/354,043

(22) Filed: Jan. 19, 2012

(65) Prior Publication Data

US 2012/0186864 A1 Jul. 26, 2012

(30) Foreign Application Priority Data

Jan. 21, 2011 (JP) .................................. 2011-011294
Dec. 7, 2011 (JP) .................................. 2011-268119

(51) Int. Cl.
*H05K 1/11* (2006.01)
*B23K 1/00* (2006.01)
*B23K 35/26* (2006.01)
(Continued)

(52) U.S. Cl.
CPC . *B23K 1/00* (2013.01); *B23K 35/22* (2013.01); *B23K 35/26* (2013.01); *C22C 11/06* (2013.01); *C22C 13/00* (2013.01); *H01L 21/4853* (2013.01); *H01L 21/6835* (2013.01); *H01L 23/49811* (2013.01); *H01L 24/00* (2013.01); *H01L 24/81* (2013.01); *H01L 23/49822* (2013.01); *H01L 24/13* (2013.01); *H01L 24/16* (2013.01); *H01L 2221/68318* (2013.01); *H01L 2221/68331* (2013.01); *H01L 2221/68345* (2013.01); *H01L 2221/68386* (2013.01); *H01L 2224/131* (2013.01); *H01L 2224/16237* (2013.01); *H01L 2224/814* (2013.01); *H01L 2224/81192* (2013.01);
(Continued)

(58) Field of Classification Search
CPC ............ H05K 2201/10318; H01L 2924/15312
USPC .................................................. 174/258, 267
See application file for complete search history.

(56) References Cited

U.S. PATENT DOCUMENTS 5,006,922 A * 4/1991 McShane et al. ............. 257/697
5,538,433 A * 7/1996 Arisaka .......................... 439/70
(Continued)

FOREIGN PATENT DOCUMENTS

| JP | 9-232373 A | 9/1997 |
| JP | 2010-080457 A | 4/2010 |
| JP | 2010-161419 A | 7/2010 |

*Primary Examiner* — Timothy Thompson
*Assistant Examiner* — Rhadames J Alonzo Miller
(74) *Attorney, Agent, or Firm* — Stites & Harbison PLLC; Jeffrey A. Haeberlin; James R. Hayne

(57) ABSTRACT

A wiring board and a method for manufacturing the wiring board reinforced by means of a resin is provided. Embodiments of the wiring board allow for reliable attachment of a connection member, like a socket, to a terminal member. For example, a base of terminal pins is put on pin grid array (PGA) terminal pads, and a bonding material paste including solder and an electric insulation material made of a resin is placed on each of the PGA terminal pads. The bonding material paste is then heated to fuse the solder and soften the electric insulation material. Subsequently, the bonding material paste is cooled to solidify the solder and bond each of the bases to a corresponding PGA terminal pad and form an electric insulation surface layer on an exposed surface of each of solder junctions to which the respective bases are bonded.

1 Claim, 15 Drawing Sheets

(51) Int. Cl.
*B23K 35/22* (2006.01)
*C22C 11/06* (2006.01)
*C22C 13/00* (2006.01)
*H01L 23/00* (2006.01)
*H01L 23/498* (2006.01)
*H01L 21/48* (2006.01)
*H01L 21/683* (2006.01)
*H05K 3/46* (2006.01)

(52) U.S. Cl.
CPC .............. *H01L 2924/15174* (2013.01); *H01L 2924/15312* (2013.01); *H05K 3/4682* (2013.01); *H05K 2201/10318* (2013.01)

(56) References Cited

U.S. PATENT DOCUMENTS

| | | | |
|---|---|---|---|
| 5,847,456 A | 12/1998 | Shoji | |
| 6,217,987 B1* | 4/2001 | Ono et al. | 428/209 |
| 2001/0015491 A1* | 8/2001 | Shiraishi | 257/697 |
| 2002/0066672 A1* | 6/2002 | Iijima et al. | 205/125 |
| 2003/0057572 A1* | 3/2003 | Berry | 257/787 |
| 2005/0263887 A1* | 12/2005 | Yang | 257/738 |
| 2008/0055874 A1* | 3/2008 | Kawade et al. | 361/773 |
| 2008/0258300 A1* | 10/2008 | Kobayashi et al. | 257/737 |
| 2008/0265398 A1* | 10/2008 | Matsumoto et al. | 257/697 |
| 2008/0296752 A1* | 12/2008 | Nakajima | 257/697 |
| 2009/0211798 A1* | 8/2009 | Horiuchi et al. | 174/262 |
| 2009/0242262 A1* | 10/2009 | Asano | 174/267 |
| 2009/0243100 A1* | 10/2009 | Akiyama | 257/738 |
| 2009/0314537 A1* | 12/2009 | Hirose et al. | 174/263 |
| 2010/0000761 A1* | 1/2010 | Oh et al. | 174/126.1 |
| 2010/0052153 A1* | 3/2010 | Koizumi et al. | 257/697 |
| 2010/0065959 A1* | 3/2010 | Horiuchi et al. | 257/692 |
| 2011/0014826 A1* | 1/2011 | Lee et al. | 439/884 |
| 2011/0014827 A1* | 1/2011 | Oh et al. | 439/884 |
| 2011/0034022 A1* | 2/2011 | Nakamura | 438/613 |
| 2011/0067899 A1* | 3/2011 | Choi et al. | 174/126.1 |
| 2011/0068473 A1* | 3/2011 | Lee et al. | 257/773 |
| 2011/0103029 A1* | 5/2011 | Kitajima | 361/774 |
| 2011/0127676 A1* | 6/2011 | Choi et al. | 257/773 |
| 2012/0043653 A1* | 2/2012 | Oh et al. | 257/735 |
| 2012/0118620 A1* | 5/2012 | Baek et al. | 174/257 |
| 2012/0120623 A1* | 5/2012 | Baek et al. | 361/767 |
| 2012/0206891 A1* | 8/2012 | Yoshioka et al. | 361/783 |
| 2013/0017740 A1* | 1/2013 | Yeh et al. | 439/884 |

* cited by examiner

WIRING BOARD AND METHOD FOR MANUFACTURING THE SAME

CROSS REFERENCE TO RELATED APPLICATIONS

The present invention claims priority from Japanese Patent Application No. 2011-011294, which was filed on Jan. 21, 2011 and Japanese Patent Application No. 2011-268119, which was filed on Dec. 7, 2011, the disclosures of which are herein incorporated by reference in its entirety.

BACKGROUND OF THE INVENTION

1. Field of the Invention

The present invention relates to a wiring board including terminal members, like pin members, put on terminal pads of a multilayer board, such as a coreless board, made by layering conductor layers and resin insulation layers one on top of the other, as well as methods for manufacturing the same.

2. Description of Related Art

There has hitherto been available a semiconductor package structured in such a way that pin members (terminal pins) are attached to a wiring board as terminal members that may function as connection terminals. In such a semiconductor package, a semiconductor chip (e.g., an IC chip) is mounted on the opposite side of a wiring board from where the terminal pins are mounted. The terminal pins can be inserted into and connected to a socket of a mount board.

For instance, a known terminal pin of this type is a rod-shaped pin that juts out of a disc-shaped base. The terminal pins are usually bonded onto respective terminal pads (e.g., PGA terminal pads) of a wiring board by use of solder, or the like. However, a technique for bonding the terminal pins by use of a resin as well as solder has recently been proposed.

For instance, a technique described in connection with JP-A-2010-80457 includes bonding a base of terminal pins to terminal pads of a wiring board with solder and covering a surface of the wiring board and a surface of the base of the terminal pins with a resin, thereby enhancing connection strength and electrical insulation.

Furthermore, JP-A-9-232373 discloses a technique for forming a reinforcement resin so as to surround roots of respective solder bumps formed on a surface of a semiconductor chip to thus enhance reliability of solder junctions.

BRIEF SUMMARY OF THE INVENTION

However, according to the technique described in connection with JP-A-2010-80457, the terminal pins are bonded by means of solder, and a surface of the wiring board and a surface (a side from which pin portions of the respective terminal pins jut) of the base of the terminal pins are covered with a resin. Thus, complicated manufacturing processes require time and effort.

Moreover, in a wiring board manufactured under the related-art manufacturing method, a front side of the base of the terminal pins is covered with a resin. The front side of the terminal pins has irregular swells. For this reason, when the terminal pins is fitted into a socket, difficulty may be encountered in reliably fitting the socket to the terminal pins.

Even the technique described in connection with JP-A-9-232373, includes forming solder bumps and subsequently forming a resin around each of the solder bumps. Therefore, there may be a problem in that manufacturing processes are complicated and involve a large amount of time and effort.

The present invention has been conceived in light of the problems of the related art and aims at providing a wiring board that can simplify manufacturing processes when solder bumps are reinforced with a resin and that enables reliable bonding of a connection member, particularly when a connection member, such as a socket, is fitted to a terminal member. The present invention also provides a method for manufacturing the wiring board.

(1) The present invention provides, as a first embodiment, a method for manufacturing a wiring board, comprising:

placing a bottom surface of a base of a pin member on a terminal pad;

placing a bonding material including a solder and an electric insulation material made of a resin in a neighborhood of the terminal pad;

heating the bonding material to fuse the solder and soften the electric insulation material; and cooling the bonding material after heating to solidify the solder, bond the base to the terminal pad, and form an electric insulation surface layer from the electric insulation material on an exposed surface of the solder to which the base is bonded; wherein the terminal pad is located on a multilayer board made by alternately stacking one or more conductor layers and one or more resin insulation layers, and the pin member includes the base and a pin that stands upright on a surface of the base.

In the present embodiment, the base of the pin member (terminal member) is put on a corresponding terminal pad, and a bonding material including solder and an electric insulation material made of a resin is placed in a neighborhood of the terminal pad. The bonding material is heated, thereby fusing the solder and softening the electric insulation material. The bonding material is subsequently cooled to thus solidify the solder and bond the base to the corresponding terminal pad. Further, the electric insulation surface layer made of the electric insulation material is formed on an exposed surface of the solder bonded to the base.

Specifically, in the present embodiment, a paste-like bonding material, for instance, is placed in a neighborhood of a terminal pad and is then heated. Solder in the bonding material is thereby fused, and the thus-fused solder can bond the terminal pad to a base of corresponding pin member. Further, an electric insulation material in the bonding material is softened, allowing the electric insulation material to cover a surface of the solder. Accordingly, in the present mode, there is yielded a superior and unexpected advantage of noticeably simplifying manufacturing processes when compared with the related arts' manufacturing methods.

In the present embodiment, it is possible to easily control the extent to which the base of each of the pin members is covered with solder, and, accordingly, coverage of the base with an electric insulation material, by controlling the amount of bonding material used. Therefore, control is performed so as not to cover a surface (i.e., a surface opposite to the wiring board) of the base with the electric insulation material. In the wiring board manufactured in accordance with the present embodiment, the surface of each of the bases remains exposed outside so that a connection member, like a socket, can reliably be attached.

In the wiring board manufactured by the manufacturing method of this embodiment, the surface of the solidified solder is covered with the electric insulation material. Hence, the terminal pads and the pin members are firmly bonded together, and there is yielded a superior and unexpected advantage of the pin members being less damaged by external stress. Simultaneously, there is also yielded an advantage of high electrical insulation and the ability to effectively prevent oxidation of the solder.

Moreover, a coreless board, from which a core board is omitted, can be adopted as the multilayer board.

Each of the pin members has a base connected to a corresponding terminal pad and a pin standing upright on the base. The base can adopt the form of a flat plate (e.g., a disc shape) having a bottom surface and a side surface and the form of an outwardly bowed shape, like a spherical bottom surface.

Copper, a copper alloy, nickel, a nickel alloy, tin, a tin alloy, and the like, can be adopted as a material for forming the conductor layer and the terminal pads. The conductor layer and the terminal pads can be formed by means of any known technique, like a subtractive technique, a semi-additive technique, a full-additive technique, and the like. For instance, a copper etching technique, an electroless copper plating technique, or an electrolytic copper plating is applied to form the conductor layer and the terminal pads. Further, a conductor layer and terminal pads can also be formed by forming a thin film by means of a sputtering technique, a CVD technique, or the like, and etching the thus-formed thin film. Alternatively, a conductor layer and terminal pads can also be formed by means of printing a conductive paste, or the like.

The resin insulation layer can be selected, as required, in consideration of insulation characteristics, heat resistance, humidity resistance, and the like. A preferred example of a polymeric material used for forming the resin insulation layer includes thermosetting resins, such as an epoxy resin, a phenolic resin, an urethane resin, a silicone resin, and a polyimide resin, or thermoplastic resins, such as a polycarbonate resin, an acrylic resin, a polyacetal resin, a polypropylene resin, and the like. In addition, there can also be employed a composite material made up of any of the resins, glass fibers (e.g., a glass woven fabric and a glass unwoven fabric) and organic fibers, like polyamide fibers, resin-resin composite materials prepared by causing a three-dimensional reticulated fluorine-based resin base material, like continuous porous PTFE, to impregnate a thermosetting resin, like an epoxy resin, and the like.

The solder included in the bonding material may be a Pb—Sn-based solder, like 90Pb-10Sn, 95Pb-5Sn, and 40Pb-60Sn, Sn—Bi-based solder, Sn—Sb-based solder, Sn—Ag-based solder, Sn—Ag—Cu-based solder, Au—Ge-based solder, Au—Sn-based solder, and the like.

A thermosetting resin may be used as the electric insulation material included in the bonding material. An epoxy resin can preferably be used as the thermosetting resin. Types of epoxy resin that can be adopted include bisphenol A types, bisphenol F types, multifunctional types, alicyclic types, biphenyl types, and the like. In addition to the epoxy resin, an acrylic resin, an oxetane resin, a polyimide resin, an isocyanate resin, and the like, can also be used as the thermosetting resin.

(2) The present invention provides, as its second embodiment, that the bonding material is a paste, and wherein the bonding material after the cooling step includes 50 percent by weight to 95 percent by weight of the solder and 5 percent by weight to 50 percent by weight of the electric insulation material, and more preferably may include 80 percent by weight to 90 percent by weight of the solder and 10 percent by weight to 20 percent by weight of the electric insulation material.

By means of this configuration, a structure can be formed that easily covers a surface of each of solder bumps with an electric insulation material.

A paste-like bonding material formed from a resin, like a thermosetting resin, and solder (e.g., solder particles, or the like) can be adopted as the bonding material. In addition to including the resin and the solder, the bonding material can also include various other components. For instance, when a thermosetting resin is used as a resin, there can be adopted a bonding material including, in addition to a thermosetting resin and solder, an agent for curing the thermosetting resin, an activator that imparts active action for eliminating an oxide film from solder, a thixo agent for controlling thixotropy of the paste, and other additives. Loadings of the additives are appropriately controlled according to the solder content in the bonding material, the particle size of solder, and the degree of progress in oxidation of an object to be bonded.

An epoxy resin can preferably be used as the thermosetting resin as mentioned above. Types of epoxy resins include bisphenol A types, bisphenol F types, multifunctional types, alicyclic types, biphenyl types, and the like.

In relation to the curing agent, a curing agent is selected that conforms to the thermosetting resin used. In the case of an epoxy resin, imidazoles, acid anhydrides, amines, hydrazides, microcapsule-type curing agents, and the like are selected. Activators used in common cream solder, such as inorganic halides, amines, and organic acids, can be used as the activators. Inorganic fine powders commonly used in an adhesive for an electronic material is formulated as the thixo agent.

In addition, if necessary, a silane coupling agent, an organic solvent, a flexible material, a pigment, a catalyst, and the like, can be added as an additive. The silane coupling agent is formulated with a view toward enhancing adhesion, and the organic solvent is used for controlling viscosity of the bonding material.

(3) Specifically, the present invention provides, as a third embodiment, the method for manufacturing a wiring board according to (1), wherein the electric insulation material is formed from a thermosetting resin, and a glass transition temperature of the thermosetting resin is a fusing point of the solder or less.

The thermosetting resin can thereby be softened before the solder is fused by heating. Consequently, solder is fused in the softened thermosetting resin, thereby forming the solder bumps. Further, an electric insulation surface layer can preferably be formed around each of the solder bumps.

An epoxy resin is preferably used as the thermosetting resin. In addition to the epoxy resin, an acrylic resin, an oxetane resin, a polyimide resin, and an isocyanate resin, and the like, can be adopted.

The glass transition temperature may fall within a range from 80 degrees centigrade to 220 degrees centigrade, and the fusing point of solder may fall within a range from 120 degrees centigrade to 230 degrees centigrade.

(4) Also, the present invention provides, as a fourth embodiment, a wiring board manufacturing method for bonding one or more terminal members to one or more terminal pads on a multilayer board, comprising:

placing a bonding material including solder and an electric insulation material made of a resin on each of the one or more terminal pads;

heating the bonding material to thus fuse the solder and soften the electric insulation material; and cooling the bonding material to solidify the solder, form the terminal members made up of the solder, and form an electric insulation surface layer made of the electric insulation material over an exposed surface of each of the terminal members; wherein the terminal pad is located on a multilayer board made by alternately stacking one or more conductor layers and one or more resin insulation layers.

In the present embodiment, the bonding material, including solder and an electric insulation material made of a resin, is put on a corresponding terminal pad. The bonding material is heated, thereby fusing the solder and softening the electric insulation material. The bonding material is subsequently cooled to solidify the solder, to thus form terminal members, and form an electrical insulation surface layer from the electric insulation material on an exposed surface of each of the terminal members.

Specifically, in the present embodiment, a paste-like bonding material, for instance, is placed on a terminal pad and is then heated. Solder in the bonding material is thereby fused, and an electric insulation material in the bonding material is softened. When the solder becomes subsequently solidified, terminal members can be formed. Moreover, a surface of the terminal member can be covered with the electric insulation material. Accordingly, when compared with the relate arts' manufacturing method, the present embodiment can yield a noticeable advantage in its ability to simplify the manufacturing process.

In the present embodiment, it is possible to easily control the extent to which the exposed surface of each of the terminal members is covered with solder, and, accordingly, the coverage of the exposed surface with an electric insulation material, by means of controlling the amount of bonding material used. Therefore, control can be performed so as not to cover a surface, such as a surface opposite to the wiring board, of the terminal member with the electric insulation material. The wiring board manufactured in the present embodiment facilitates easy electrical connections of various electrical conductive members.

In the wiring board manufactured under the manufacturing method of the present embodiment, a surface of each of the solidified terminal members is covered with an electrical insulation material. Accordingly, the terminal pad and a corresponding terminal member are firmly bonded together, thereby yielding a superior and unexpected advantage of making the terminal members less susceptible to damage from external force. Simultaneously, a portion of each of the terminal members covered with the electric insulation material exhibits a superior and unexpected advantage of high electrical insulation and the ability to effectively prevent oxidation.

Various multilayer boards, various materials and methods used for forming the conductor layers and the terminal pads, materials of the resin insulation layer, materials of solder of the terminal member, and electrical insulation materials, such as those exemplified in the first embodiment, can be adopted in the present embodiment as well.

(5) The present invention provides, as a fifth embodiment, a wiring board comprising:

terminal members put on terminal pads of a multilayer board made by alternately stacking one or more conductor layers and one or more resin insulation layers, wherein each of the terminal members is a pin member including a base whose bottom surface is bonded to each of the terminal pads by way of solder and a pin that stands upright on a surface of the base; and an electric insulation surface layer made of an electric insulation material formed over an exposed surface of the solder to which the base is bonded, wherein the solder is bonded to the bottom surface of each of the bases and the solder is not bonded to the surface of each of the bases.

In the wiring board of the present embodiment, solder is bonded to the bottom surface of the base of each of the pin members (terminal members). However, solder is not bonded to the surface of the base. Further, the electrical insulation surface layer made of an electrical insulation material is formed over an exposed surface of the solder.

Accordingly, a connection member, like a socket, can reliably be attached to the pin member. Moreover, since the exposed surface of the solder is covered with the electrical insulation surface layer, there is yielded a superior and unexpected advantage of high bonding strength, superior electrical insulation, and the ability to prevent oxidation of solder.

The essential requirement for the range over which solder and each of the bases are to be bonded is that the surface of each of the bases should remain uncovered with the solder or the electrical insulation surface layer. Hence, a side surface of each of the bases can be bonded to the solder and the electrical insulation surface layer.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

Embodiments to which the present invention is applied are hereunder described by reference to the drawings.

First Embodiment

Explanations are given for, as an example, an electronic component mount wiring board (hereinafter a "wiring board") in which an IC chip, or the like, is to be mounted on one principal surface of a coreless board.

First, a configuration of a wiring board (e.g., a pin grid array) of the present embodiment is described by reference to FIGS. 1 through 4.

Figure 1:
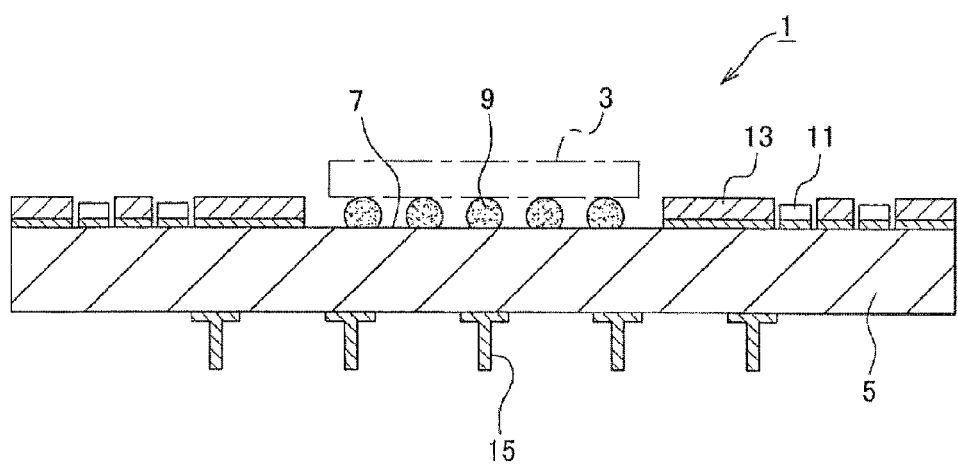
FIG. 1 is a cross sectional view showing a general configuration of an electronic component mount wiring board of a first embodiment broken in its thicknesswise direction.

As shown in FIG. 1, a wiring board 1 of the present embodiment is a semiconductor package used for mounting an IC chip 3. The wiring board 1 primarily has a coreless board 5 (e.g., a multilayer board) formed so as not to include a core board.

A plurality of solder bumps 9 are formed within a mount region 7 (see FIG. 2A) of the IC chip 3 on one principal surface side (a first principal surface), which is shown as an upper side in FIG. 1 of the multilayer board 5; namely, a side of the multilayer board 5 on which the IC chip 3 is mounted. A plurality of chip capacitors 11 (CP) are mounted to a neighborhood of the mount region 7, and a reinforcement plate 13 (a stiffener) is bonded to the neighborhood.

A plurality of terminal pins 15 are placed upright on another principal surface side (a second principal surface), which is shown as a lower side of FIG. 1, of the multilayer board 5. The terminal pins 15 correspond to terminal members (pin members) of the present invention.

Possible configurations are hereunder described in detail.

Figure 2A:
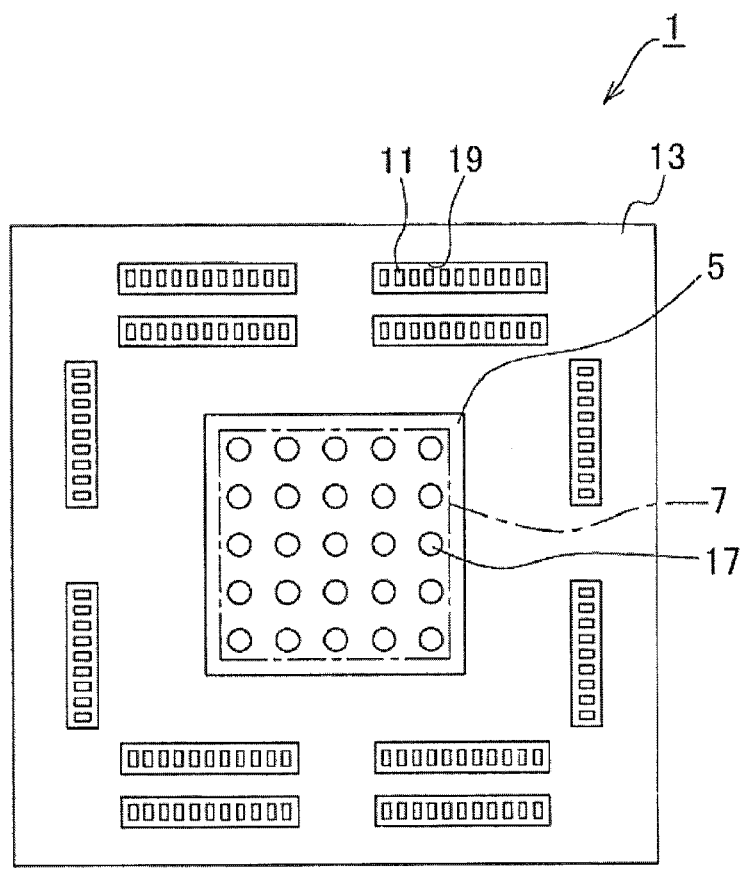
FIG. 2A is a plan view showing a first principal surface of an electronic component mount wiring board of an embodiment.

As shown in FIG. 2A, the substantially square mount region 7 is provided at a center of the first principal surface side of the multilayer board 5. A plurality of chip mount terminal pads 17, where the solder bumps 9 for bonding the IC chip 3 to the multilayer board 5 are formed, are formed in an array within the mount region 7. The solder bumps 9 are omitted from FIG. 2A.

The plurality of chip capacitors 11 are mounted on the first principal surface along respective sides of the surrounding area of the mount region 7. Further, the stiffener 13 is bonded on the first principal surface side so as to cover an area of the first principal surface other than the mount region 7 for the IC chip 3 and rectangular mount regions 19 for mounting the chip capacitors 11.

Figure 2B:
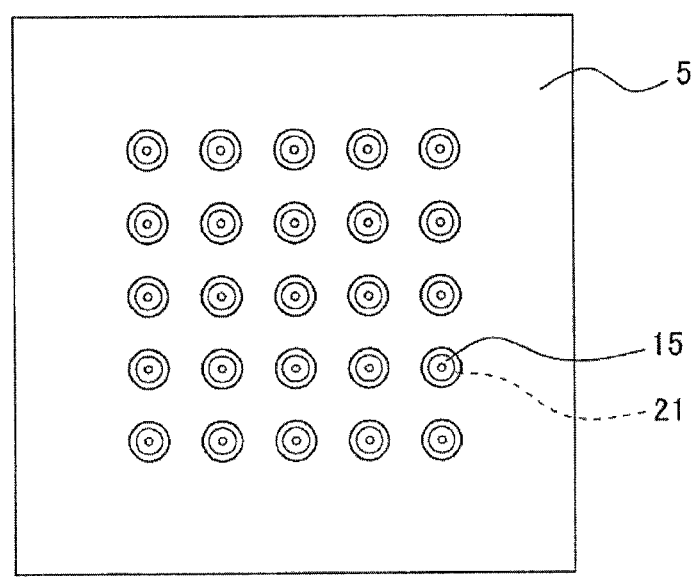
FIG. 2B is a plan view showing a second principal surface of the electronic component mount wiring board of an embodiment.

In the meantime, as shown in FIG. 2B, a plurality of pin grid arrays (PGA) terminal pads 21 are placed in an array form on a back side (the second principal surface side) of the multilayer board 5. The terminal pins 15 are bonded onto the respective PGA terminal pads 21 used for attaching a socket of; for instance, a mother board (e.g., a mount board).

Figure 3:
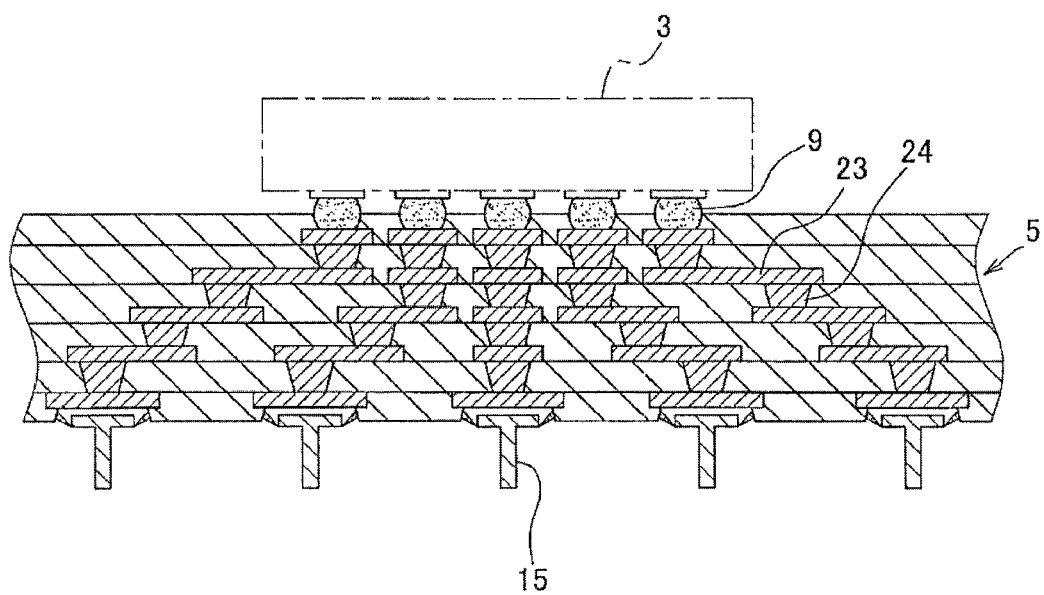
FIG. 3 is a cross sectional view showing a center portion of an electronic component mount wiring board of an embodiment while broken in its thicknesswise direction.

As can be seen from a cross section of the center portion of the wiring board 1 shown in FIG. 3, layers, like conductor layers 23 and via conductors 24, are formed within the multilayer board 5. The solder bumps 9 on the first principal surface side of the multilayer board 5 and the terminal pins 15 of the second principal surface side are electrically connected together by means of the conductor layers 23 and the via conductors 24.

Figure 4:
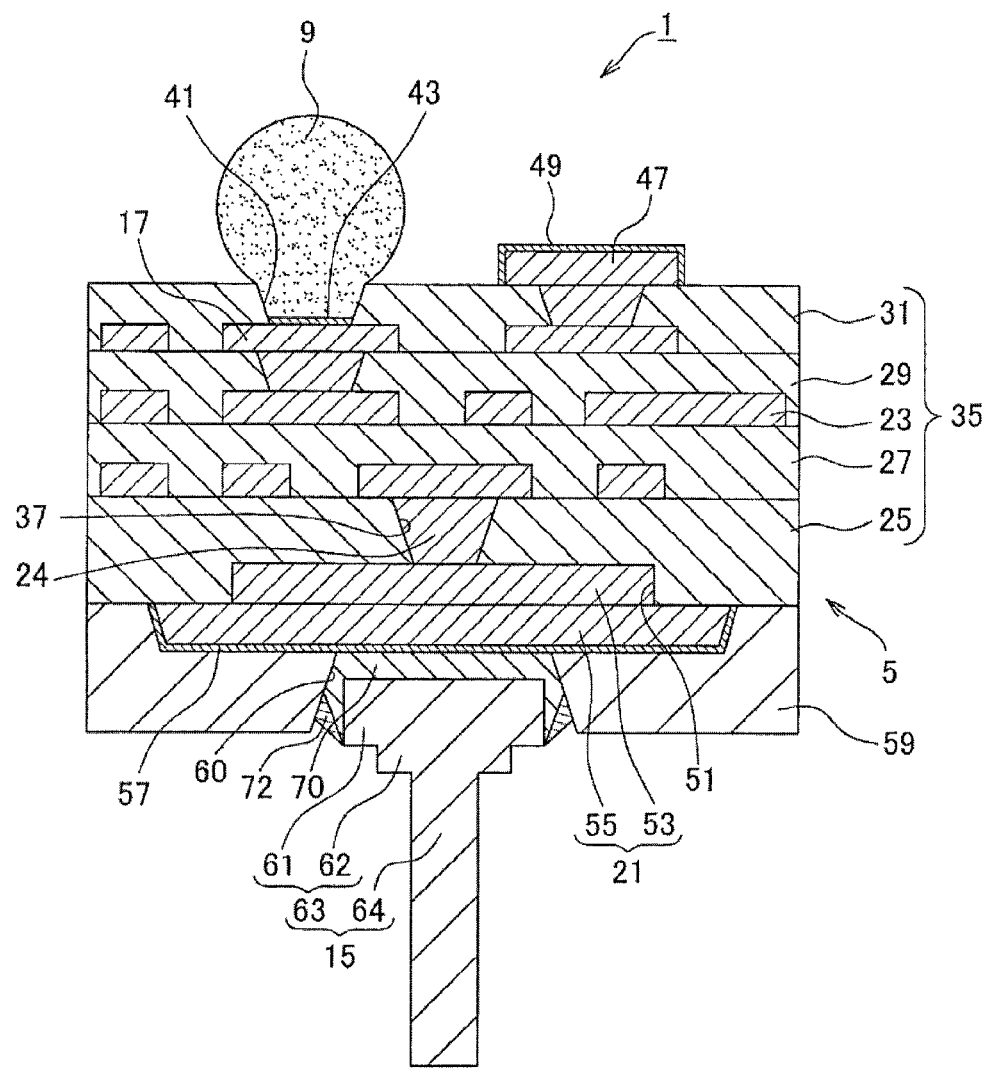
FIG. 4 is an enlarged longitudinal cross sectional view showing an embodied multilayer board as seen from a cross section perpendicular to the principal surface.

As shown in the partially enlarged mount wiring board 1 in FIG. 4, the multilayer board 5 has a wire layered block 35 in which a plurality of (e.g., four) resin insulation layers 25, 27, 29, and 31 primarily including the same resin insulation material, such as an electrically insulating material, and a conductor layer 23, made of for example, copper, are layered one on top of the other.

The resin insulation layers 25, 27, 29, and 31 are formed from a resin insulation material not imparted with a photo-curing characteristic; specifically, a build-up material that includes as a main body a cured body of thermosetting epoxy resin.

Each of the resin insulation layers 25, 27, 29, and 31 is provided with a via hole 37 and a via conductor 24. The via conductor 24 has a tapered shape whose first primary surface side has a larger diameter and electrically interconnects the conductor layer 23, the chip mount terminal pad 17, and the PGA terminal pad 21.

A plurality of surface openings 41 are formed in the outermost resin insulation layer 31 on the first principal surface side of the wire layered block 35. The chip mount terminal pad 17 is formed within each of the surface openings 41 so as to become lower than an exterior surface of the resin insulation layer 31. The chip mount terminal pad 17 has such a structure as to cover only an upper surface of a principal copper layer with a plating layer 43 (e.g., nickel-gold plating) other than copper.

As shown in FIG. 4, the surface opening 41 is filled, whereby a substantially spherical, upwardly protruding solder bump 9 is formed on corresponding chip mount terminal pads 17. A capacitor terminal pad 47 to which the chip capacitor 11 is bonded is formed on the first principal surface side of the multilayer board 5. The capacitor terminal pads 47 are formed from a copper layer that is a principal body. Each of the capacitor terminal pads 47 has a structure that covers an upper surface and a side surface of the copper layer that is a principal body with a plating layer 49 (e.g., a nickel-gold plating) other than copper.

In the meantime, a plurality of back openings 51 are formed in the resin insulation layer 25 that is the outermost layer on the back side (the second principal surface side) of the wire layered block 35. The PGA terminal pads 21 are arranged in correspondence with the respective back openings 51. Specifically, each of the PGA terminal pads 21 has a two-stage structure made up of a lower metal conductor portion 53 situated in the back opening 51 and an upper metal conductor portion 55 covering the lower metal conductor portion 53 and its surrounding area. Each of the PGA terminal pads 21 has a structure in which an upper surface and a side surface of the principal copper layer are covered with a plating layer 57 (e.g., nickel-gold plating) other than copper.

Particularly, in the present embodiment, a solder resist layer 59 made up of a photo-curable epoxy resin is formed so as to cover a back-side surface (the second principal surface side) of the wire layered block 35. Circular terminal openings 60 downwardly opening in the drawing are formed in the solder-resist layer 59 in such a way that one terminal opening 60 comes to a center on a corresponding PGA terminal pad 21. The terminal pin 15 is bonded to each of the terminal openings 60 so as to stand upright with respect to the multilayer board 5.

Each of the terminal pins 15 is formed by plating a surface of a metallic member made of, for instance, copper with gold. The terminal pin 15 is made up of a disc-shaped base 63 and a columnar pin 64 standing upright at the center of the base 63. The base 63 has a two-stage structure in which an overlap exists between a bottom portion 61 formed from a disc-shaped flat plate and an upper portion 62 formed from a disc-shaped flat plate that is smaller in diameter than the bottom portion 61. The pin 64 vertically stretches from the upper portion 62.

Each of the terminal pins 15 is bonded to a corresponding PGA terminal pad 21 in each of the terminal openings 60 by means of a solder junction 70 made of solder. More specifically, the solder junction 70 is bonded to a corresponding terminal pin 15 so as to cover a bottom surface (upper side in the drawing) and a side surface of the bottom portion 61 of the base 63.

Further, a surface, shown as a lower surface in FIG. 3, through which the solder junctions 70 become exposed is covered with an electric insulation surface layer 72 made of a thermosetting resin, such as an epoxy resin, or the like. More specifically the electric insulation surface layer 72 covers the surface of the solder junction 70 in such a way that the surface of the solder junction 70 will not become exposed outside without space between the electric insulation surface layer 72 and the surface of the solder junction 70. However, the surface of the base 63, shown as a lower side in FIG. 4, remains uncovered.

A material having a glass transition temperature that is equal to a fusing point of solder or less is used as the thermosetting resin. There is employed a thermosetting resin material whose glass transition point falls within a range from 80 degrees centigrade to 220 degrees centigrade; for instance, a thermosetting resin whose glass transition temperature is 95 degrees centigrade. Further, solder whose fusing point ranges from 120 degrees centigrade to 230 degrees centigrade; for instance, Sn—Bi-based solder whose fusing point is 139 degrees centigrade is used.

A method for manufacturing the mount wiring board 1 described as the first embodiment is now described by reference to FIGS. 5 through 8.

Process for Manufacturing a Multilayer Wiring Board

A support board, such as a glass epoxy board, or the like, having sufficient strength is first prepared, and the resin insulation layers 25, 27, 29, and 31 and the conductor layer 23 are built up on a support board 65, thereby forming the wire layered block 35.

Figure 5A:
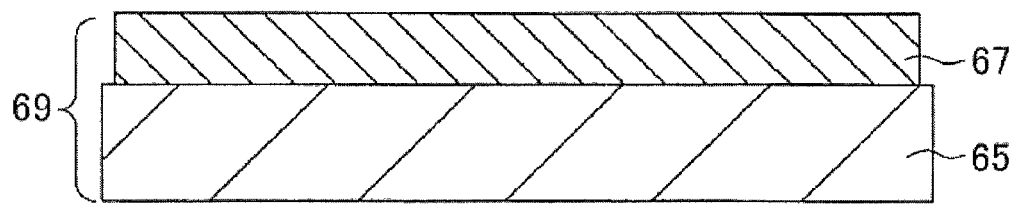
FIGS. 5A, 5B, 5C, 5D, and 5E are explanatory views showing procedures of a method for manufacturing an embodied electronic component mount wiring board while respective members are broken in their thicknesswise direction.

Specifically, as shown in FIG. 5A, a sheet-like insulation resin base material made of epoxy resin is affixed onto the support board 65, thereby forming a base resin insulation layer 67. Thus, a base material 69 is prepared.

Figure 5B:
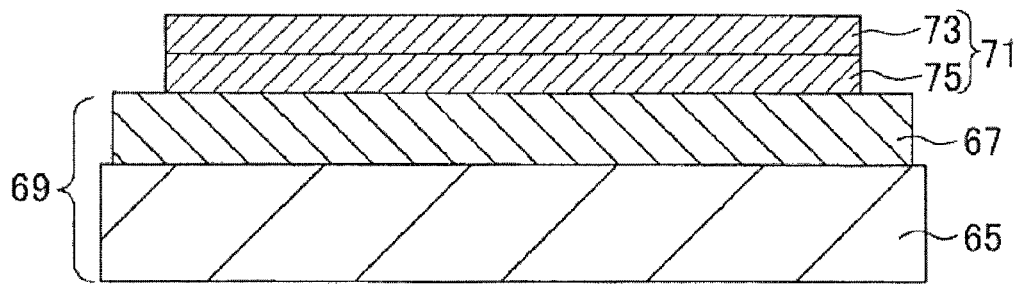

As shown in FIG. 5B, a multilayer metal sheet body 71 is laid over an upper surface of the base material 69. The multilayer metal sheet body 71 is formed by bringing two copper foils 73 and 75 into close contact with each other in a removable manner.

Figure 5C:
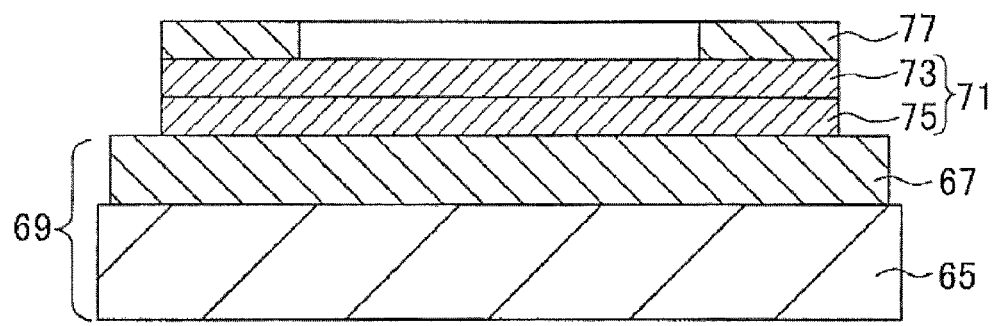

As shown in FIG. 5C, a plating resist 77 conforming to a shape of the lower metal conductor portion 53 is formed over an upper surface of the multilayer metal sheet body 71 in order to form the lower metal conductor portion 53.

Specifically, a dry film for forming the plating resist 77 is laminated over the upper surface of the multilayer metal sheet body 71. The dry film is subjected to exposure and development, thereby forming the plating resist 77.

Figure 5D:
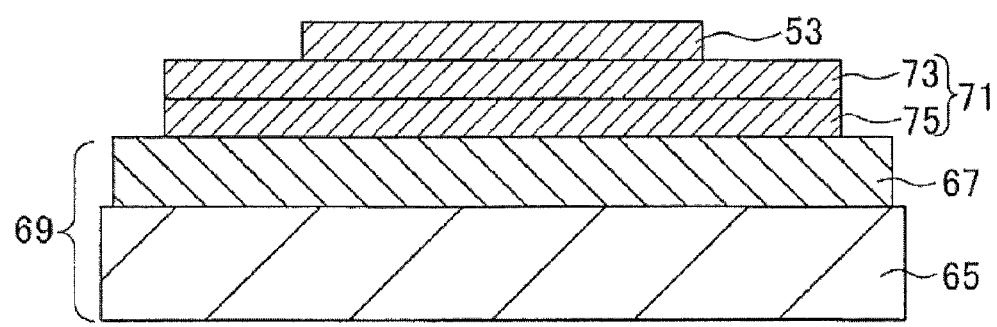

As shown in FIGS. 5C and 5D, electrolytic copper plating is selectively performed while the plating resist 77 is formed, to thus form the lower metal conductor portion 53 on the multilayer metal sheet body 71. Subsequently, the plating resist 77 is peeled.

Figure 5E:
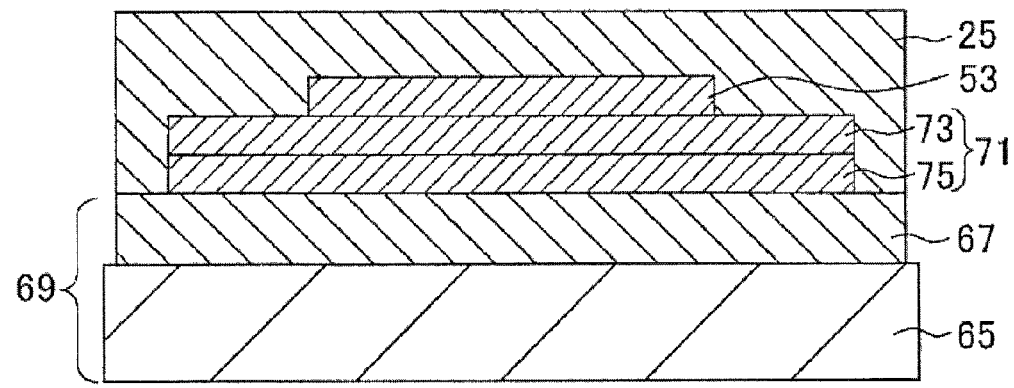

As shown in FIG. 5E, the sheet-like resin insulation layer 25 is arranged so as to wrap the multilayer metal sheet body 71 on which the lower metal conductor portion 53 is formed. The resin insulation layer 25 is then brought into contact with the lower metal conductor portion 53 and the multilayer metal sheet body 71.

Figure 6A:
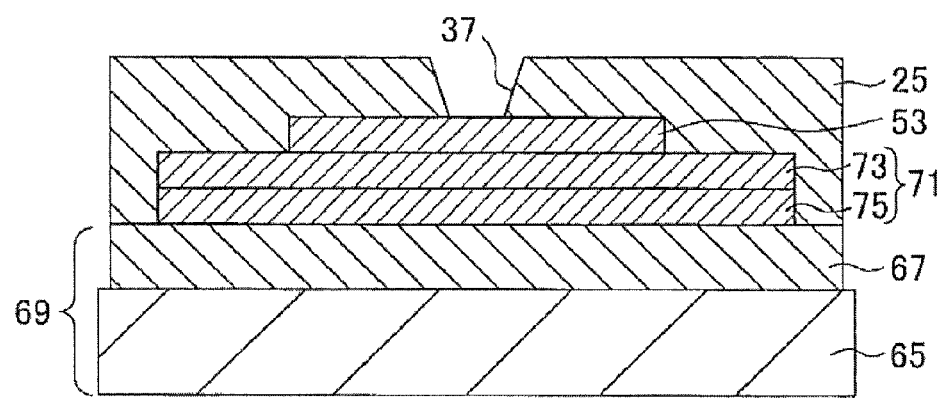
FIGS. 6A, 6B, and 6C are explanatory views showing procedures of the method for manufacturing an embodied electronic component mount wiring board while the respective members are broken in their thicknesswise direction.

As shown in FIG. 6A, the via holes 37 are formed at predetermined positions of an upper portion of the lower metal conductor portion 53 in the resin insulation layer 25 by means of laser beam machining involving use of, for instance, excimer laser, UV laser, and $CO_2$ laser. Next, a smear is eliminated from the inside of each of the via holes 37 by use of an etchant, like a permanganic acid potassium salt solution or $O_2$ plasma laser.

Figure 6B:
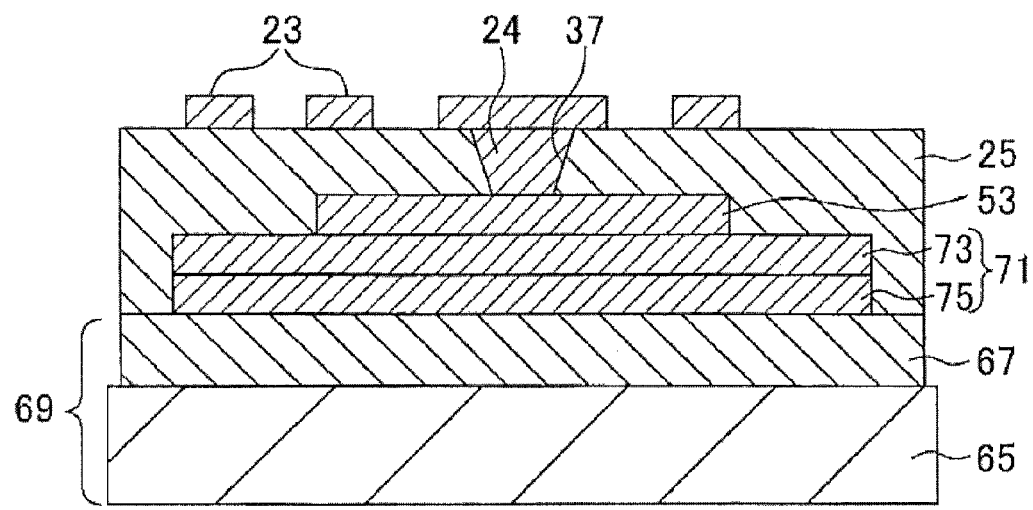

As shown in FIG. 6B, the via holes are subjected to electroless copper plating or electrolytic copper plating according to a hitherto-known technique, whereupon the via conductor 24 is formed in each of the via holes 37. Further, the board is etched by means of a known technique (e.g., a semi-additive technique), whereby the conductor layer 23 is formed in the form of a pattern over the resin insulation layer 25.

Figure 6C:
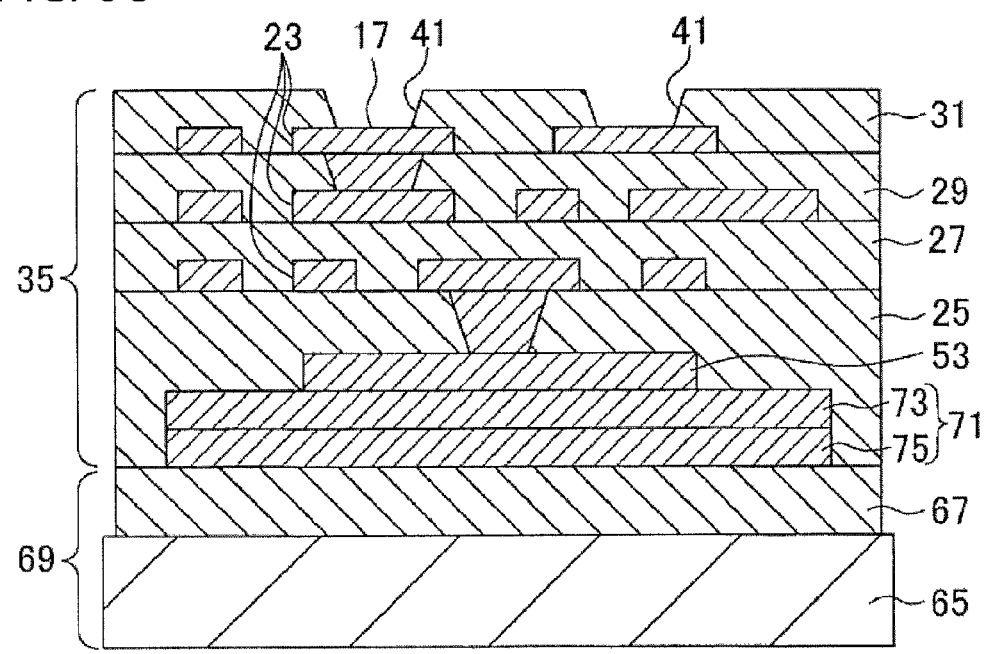

As shown in FIG. 6C, the other resin insulation layers 27, 29, and 31 and the other conductor layers 23 are also sequentially formed by means of the same technique as that employed to form the resin insulation layer 25 and the conductor layer 23. The plurality of surface openings 41 are formed in the outermost resin insulation layer 31 by means of laser beam machining. Next, a smear is eliminated from each of the surface openings 41 by use of a permanganic acid potassium salt solution or $O_2$ plasma laser.

Next, an upper surface of the resin insulation layer 31 is subjected to electroless copper plating, thereby forming a full plating layer (not shown) that covers interiors of the surface openings 41 of the resin insulation layer 31 and the upper surface of the resin insulation layer 31. Plating resist (not shown), like the plating resist having the openings formed at positions corresponding to the capacitor terminal pads 47, is formed over the upper surface of the wire layered block 35.

Figure 7A:
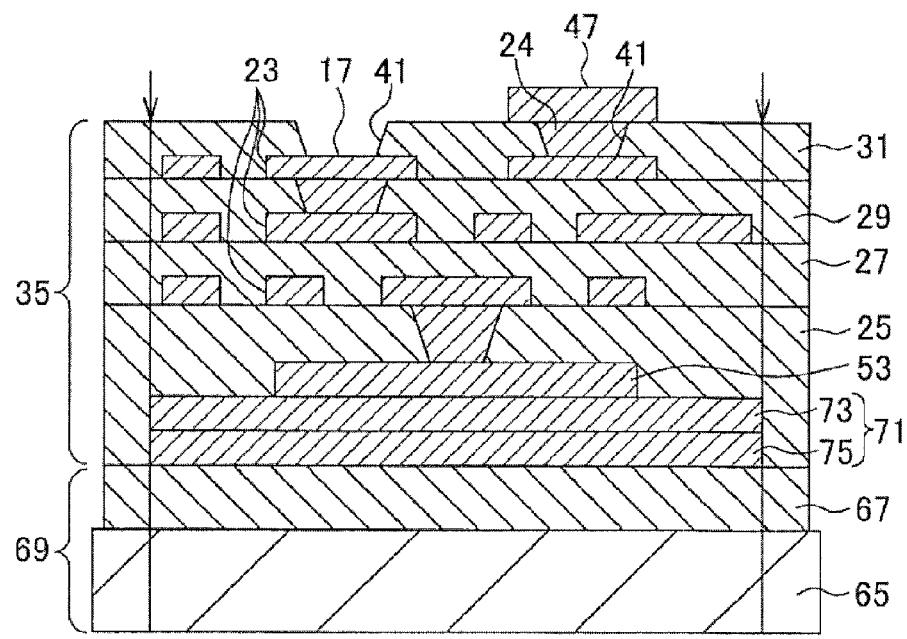
FIGS. 7A and 7B are explanatory views showing procedures of the method for manufacturing an embodied electronic component mount wiring board while the respective members are broken in their thicknesswise direction.

The surface of the board over which the plating resist is formed is then subjected to selective pattern plating. Thereby, as shown in FIG. 7A, the via conductors 24 are formed within some of the plurality of surface openings 41, and the capacitor terminal pads 47 are formed on the respective via conductors 24. The pads are patterned by means of the semi-additive technique, thereby eliminating the full plating layer with the via conductors 24 and the capacitor terminal pads 47 left.

The wire layered block 35 is then cut along lines designated by arrows through use of a dicing machine (not shown), thereby eliminating surrounding areas of the wire layered block 35.

Figure 7B:
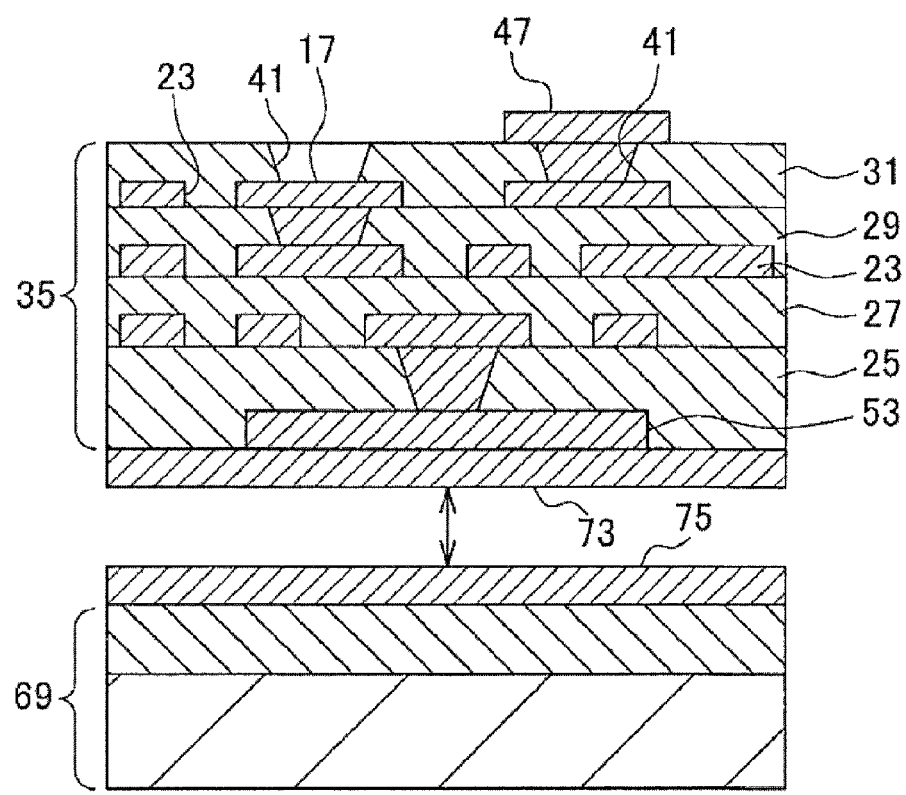

As shown in FIG. 7B, the pair of pieces of copper foil 73 and 75 of the multilayer metal sheet body 71 are peeled off from each other along an interface, thereby removing the base material 69 from the wire layered block 35. Thus, the copper foil 73 is exposed.

Figure 8A:
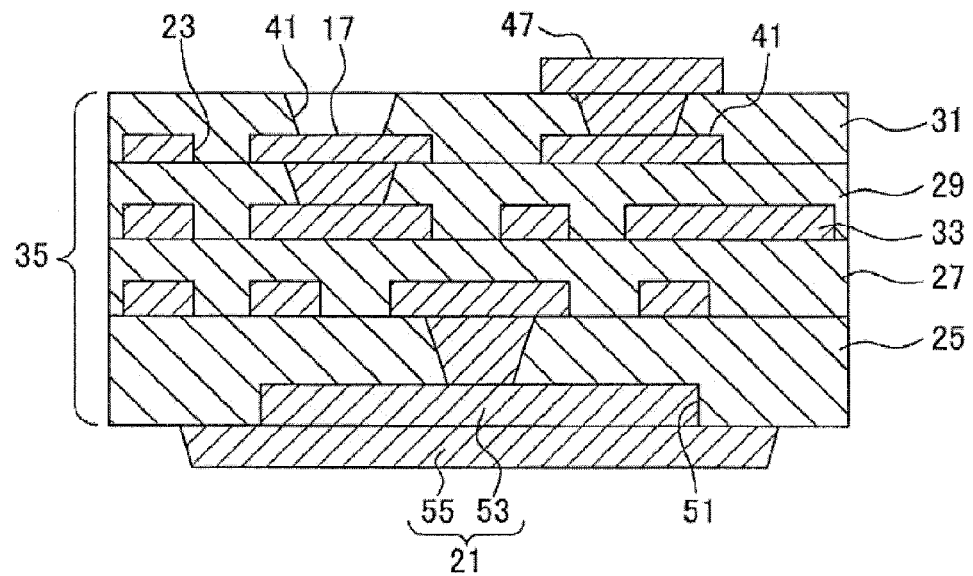
FIGS. 8A, 8B, and 8C are explanatory views showing procedures of the method for manufacturing an embodied electronic component mount wiring board while the respective members are broken in their thicknesswise direction.

As shown in FIG. 8A, the copper foil 73 is partially etched away on the lower surface side (the second principal surface side) of the wire layered block 35 with the lower metal conductor portion 53 being left, thereby forming the upper metal conductor portion 55.

Figure 8B:
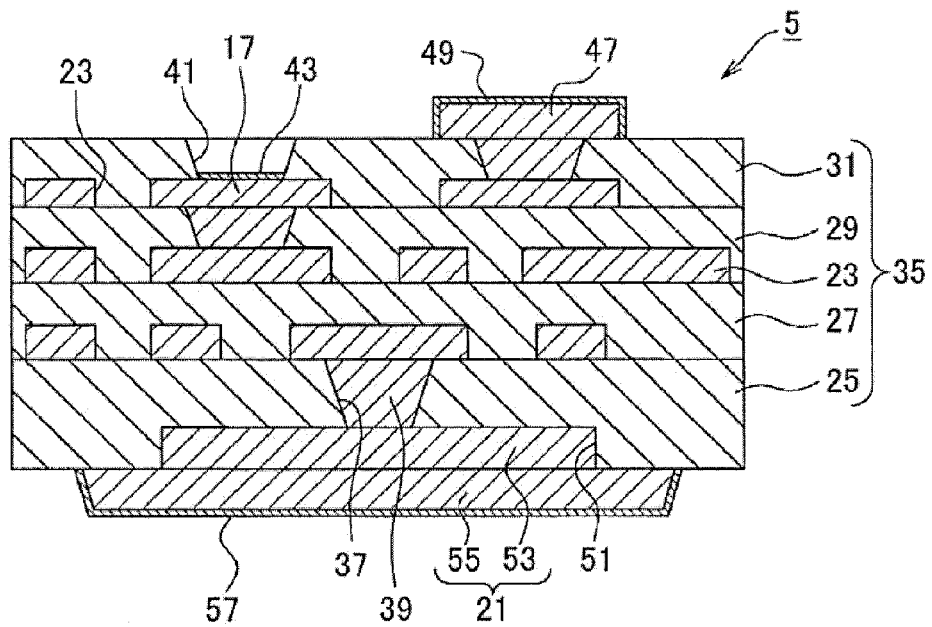

As shown in FIG. 8B, a surface of each of the chip mount terminal pads 17, a surface of each of the capacitor terminal pads 47, and a surface of each of the PGA terminal pads 21 are subjected to electroless nickel plating and electroless gold plating in this sequence, thereby forming the nickel-gold plating layers 43, 49, and 57.

Figure 8C:
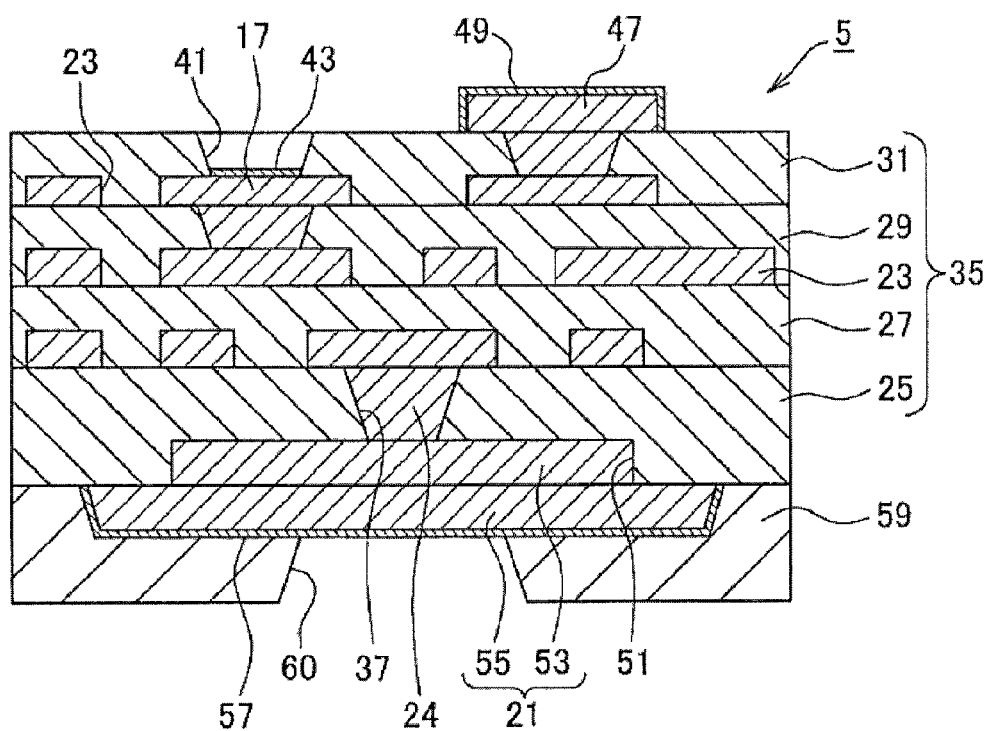

As shown in FIG. 8C, the lower surface side (the second principal surface side) of the wire layered block 35 is coated with a photosensitive epoxy resin and then solidified, whereby the solder resist layer 59 covering the entire surface of the wire layered block 35 is formed.

Next, a predetermined mask is laid on the solder resist layer 59, to thus be exposed and developed. The solder resist layer is patterned in such a way that the terminal openings 60 are formed at positions corresponding to the PGA terminal pads 21.

Process for Forming Solder Bumps

Brief explanations are now given for an exemplary method for forming the solder bumps 9 on the respective chip mount terminal pads 17.

Though not illustrated, a solder print mask is put on a surface of the first principal surface side of the multilayer board 5 manufactured by the, for example, above-described manufacturing method. In the solder print mask, print openings having a shape similar to a planar shape of each of the chip mount terminal pads 17 are formed at positions corresponding to the respective chip mount terminal pads 17.

Next, the multilayer board 5 is subjected to printing by use of the solder print mask and known solder paste that is a print material, thereby filling print openings in the solder print mask with the solder paste. Next, the solder print mask is peeled off from the multilayer board 5. The solder paste is layered on each of the chip mount terminal pads 17. The solder paste is then heated and then cooled, to thus form the solder bumps 9.

An exemplary method for bonding the terminal pins 15 on the respective PGA terminal pads 21 is now described.

Figure 9A:
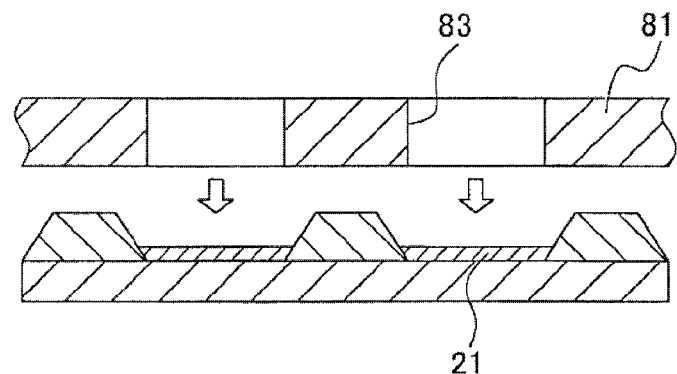
FIGS. 9A, 9B, 9C, and 9D are explanatory views showing procedures employed when bonding embodied terminal pins while the electronic component mount wiring board is broken in its thicknesswise direction.

As shown in FIG. 9A, the second principal surface side of the multilayer board 5 manufactured by the manufacturing method is upwardly oriented, and a solder print mask 81 is placed on the second principal surface. In the solder print mask 81, a print opening 83 having a shape analogous to a planar shape (e.g., a disc shape) of each of the PGA terminal pads 21 is formed in a position corresponding to each of the PGA terminal pads 21.

Figure 9B:
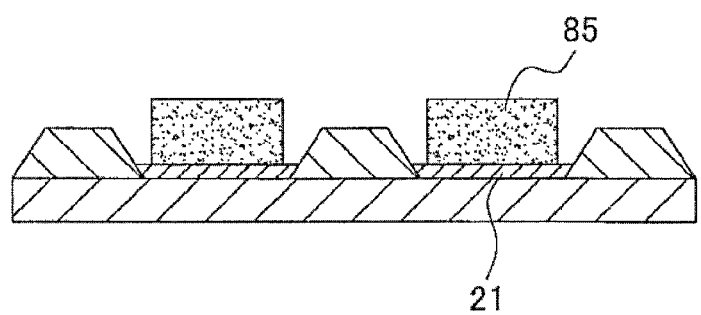

Next, as shown in FIG. 9B, printing is performed by use of the solder print mask 81 and a bonding material 85 (e.g., a bonding material paste) that is a printing material. Specifically, the print openings 83 of the solder print mask 81 are filled with the bonding material paste 85. Subsequently, the solder print mask 81 is peeled off, to thus form a layer of disc-shaped bonding material paste 85 on each of the PGA terminal pads 21.

In addition to including solder and a thermosetting resin, the bonding material paste 85 used in the embodiment includes various components (e.g., an organic solvent and an additive) for pasting the bonding material. A composition of the bonding material paste that can be adopted includes, for instance, 85 percent by weight of Sn—Bi-based solder, 10 percent by weight of epoxy resin that is, for example, a thermosetting resin, and 5 percent by weight of one or more other components.

In relation to a ratio of solder to a thermosetting resin in a solid component (i.e., solder and a thermosetting resin) achieved after bonding, solder accounts for, for example, 85 percent by weight within a range from 50 percent by weight to 95 percent by weight, and a thermosetting resin accounts for, for example, 15 percent by weight within a range from 5 percent by weight to 50 percent by weight.

Figure 9C:
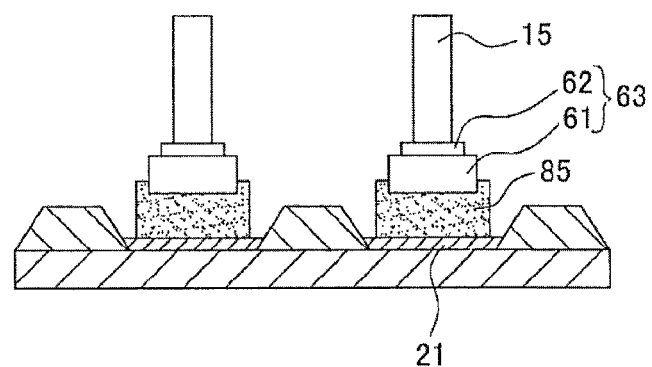

Next, as shown in FIG. 9C, the terminal pin 15 is put on each bonding material paste 85. More specifically, the bottom portion 61 of the base 63 of the terminal pin 15 is put on and slightly pushed into corresponding bonding material paste 85.

Figure 9D:
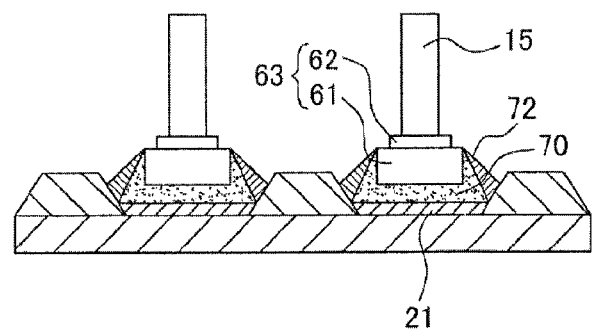

As shown in FIG. 9D, the bonding material paste 85 is heated and subsequently cooled, to thus form the solder junction 70 and the electrical insulation surface layer 72.

More specifically, there is applied a heating profile set on the basis of, for instance, a heating temperature ranging from 140 degrees centigrade to 230 degrees centigrade and a heating time ranging from 5 seconds to 300 seconds. For instance, a heating temperature of about 180 degrees centigrade and a heating time of 180 seconds are set the specific embodiment. The heating temperature is set so as to become higher than the fusing temperature of solder and the glass transition temperature of the thermosetting resin.

Accordingly, in the present embodiment, the epoxy resin in the bonding material paste 85 becomes softened when heated to a temperature that is higher than a glass transition temperature of, for example, 120 degrees centigrade.

Subsequently, when heated to a temperature at which solder becomes fused (e.g., 140 degrees centigrade), the solder becomes fused in the softened epoxy resin, to thus become integrated. The surface (the second principal surface side) of the multilayer board through which solder becomes exposed is simultaneously covered with an epoxy resin. When the temperature further goes up, the epoxy resin becomes solidified in this state, to thus form the electric insulation surface layer 72.

When the temperature falls to a normal temperature (e.g., room temperature or a temperature below the solder solidification point), the solder becomes solidified, to thus form the solder junctions 70. Thus, there is produced a junction structure in which a surface of the solder junction 70 is covered with the electric insulation surface layer 72.

In particular, in the embodiment, the solder and the electric insulation material do no cover a surface, shown as an upper side shown in FIG. 9, of the base 63 in each of the terminal pins 15. This can be accomplished by controlling an amount of bonding material paste 85 in consideration of a size of the terminal opening 60 formed at a position above the corresponding PGA terminal pad 21 and a size of the base 63 of the corresponding terminal pin 15.

Mounting of the chip capacitor 11 and bonding of the stiffener 13 can be performed after performance of the process for forming a solder resist layer.

As mentioned above, in the present embodiment, the base 63 of the terminal pin 15 is put on the corresponding PGA terminal pad 21. The bonding material paste 85 including solder and an electric insulation material made of a resin is put on the corresponding PGA terminal pad 21. The bonding material paste 85 is heated, thereby fusing solder and softening the electric insulation material. The bonding material paste 85 is then cooled, to thus solidify the solder and bond the base 63 to the corresponding PGA terminal pad 21. Further, the electric insulation surface layer 72 is formed on an exposed surface of the solder junction 70 bonded to the base 63. When compared with the related arts' manufacturing methods, the embodied method of the present invention thereby yields a noticeable advantage of the ability to simplify the manufacturing processes.

In the present embodiment, the amount of bonding material paste 85 used is controlled, whereby an extent to which the base 63 of the terminal pin 15 is covered with solder or a range where the base is coated with an electric insulation material can readily be controlled. Consequently, as in the present embodiment, for a wiring board 1 in which a front surface side of each of the bases 63 is not covered with the electric insulation material, attachment of a connection member, like a socket, can be reliably carried out.

Moreover, in the wiring board 1 of the present embodiment, a surface of solidified solder is covered with an electric insulation material. Hence, the PGA terminal pad 21 and the corresponding terminal pin 15 are firmly bonded together. Hence, there is yielded an advantage of the pad and the terminal pin being less prone to damage stemming from external stress. There are also yielded an advantage of enhanced electric insulation and an advantage of the ability to effectively prevent oxidation of solder.

Moreover, in the present embodiment, a configuration in which solder accounts for 50 percent by weight to 95 percent by weight and in which an electric insulation material accounts for 5 percent by weight to 50 percent by weight is adopted for a component that will form a solid body of the bonding material paste 85. Accordingly, there can be adopted a structure in which a surface of each of the solder junction 70 is easily covered with an electric insulation material.

Second Embodiment

A wiring board of a second embodiment is now described. Explanations about specific aspects that are identical with those described in connection with the first embodiment are omitted.

Figure 10:
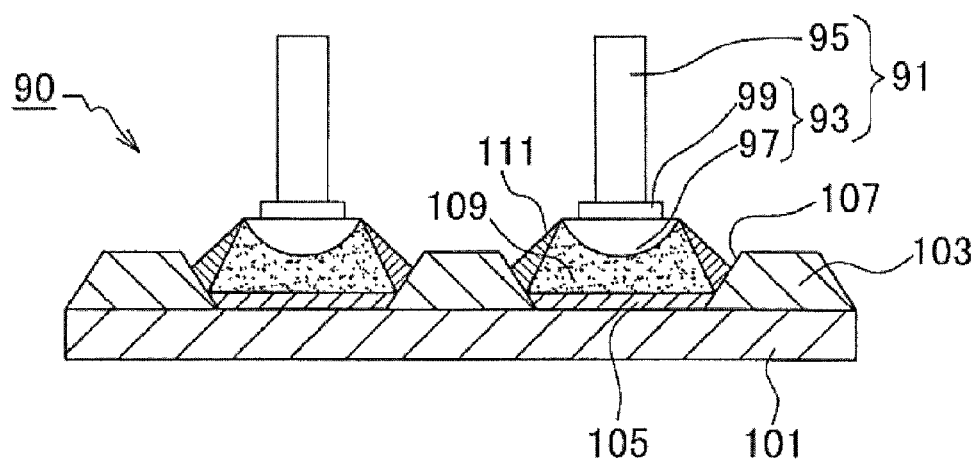
FIG. 10 is an explanatory view showing embodied terminal pins bonded to an electronic component mount wiring board of a second embodiment while the wiring board is broken in its thicknesswise direction.

As shown in FIG. 10, a terminal pin 91 used in a wiring board 90 of the present embodiment differs in shape from its counterpart employed in the first embodiment.

Specifically, each of the terminal pins 91 used in the embodiment are made up of a base 93 and a pin 95 standing upright on the base 93. The base 93 is made up of a bottom portion 97 and an upper portion 99. In particular, the bottom portion 97 assumes a disc shape in which an entire bottom shown in a lower portion of FIG. 10 assumes a spherically convex shape.

In the embodiment, as in the first embodiment, a terminal opening 107 is formed at a position on a solder resist layer 103 formed over a surface of a multilayer board 101; namely, on a corresponding PGA terminal pad 105. The base 93 of the terminal pin 91 is bonded to the terminal opening 107.

More specifically, a solder junction 109 made of solder is formed within the corresponding terminal opening 107, so as to contact an entire curved bottom surface of the bottom portion 97 of the base 93. Each of the terminal pins 91 is bonded to the corresponding PGA terminal pad 105 by means of the solder junction 109.

Moreover, an electric insulation surface layer 111 made of an electric insulation material is formed so as to cover an entire surface (an exposed surface) of the solder junction 109.

The solder junction 109 and the electric insulation surface layer 111 are formed so as not to cover a surface (an upper side in the FIG. 10) of each base 93 in the same manner as in the first embodiment.

Therefore, the present embodiment also yields an advantage similar to that yielded in the first embodiment.

Third Embodiment

A wiring board and a method for manufacturing the wiring board of a third embodiment are now described. Descriptions of specific aspects that are similar to those described in connection with the first embodiment are omitted or simplified.

As shown in FIG. 11, in the wiring board (e.g., BGA board) and the method for manufacturing the wiring board of the third embodiment, the terminal member is formed not from terminal pins used in the first embodiment but from solder.

Figure 11A:
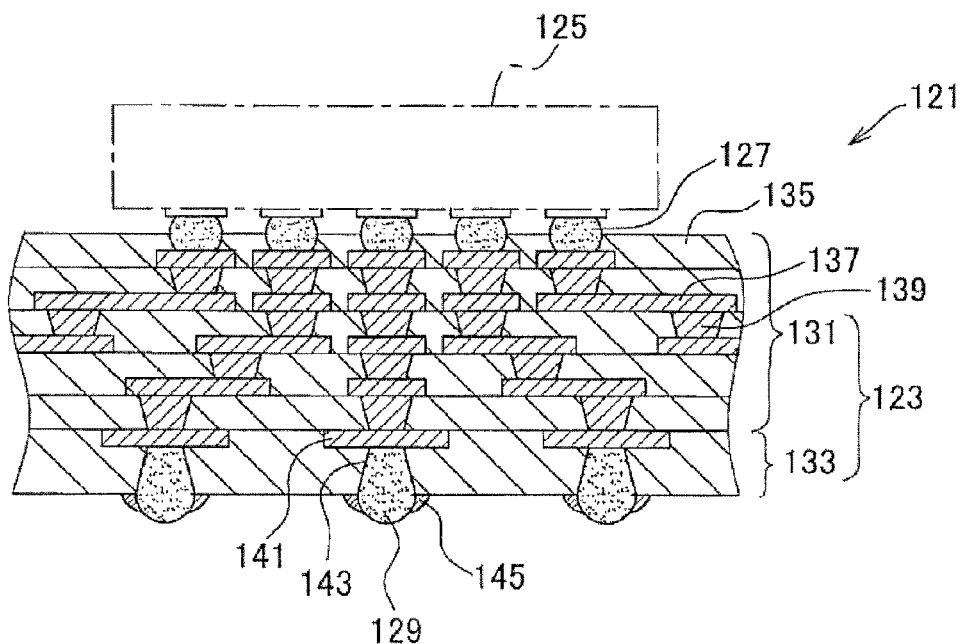
FIG. 11A is a cross sectional view showing the general configuration of an electronic component mount wiring board of a third embodiment while the wiring board is broken in its thicknesswise direction, wherein an IC chip side of the board is upwardly oriented)

As shown in FIG. 11A, a wiring board 121 of the present embodiment has a multilayer board 123 having substantially the same structure as its counterpart described in connection with the first embodiment.

A plurality of solder bumps 127 are formed on one principal side (a first principal surface), shown as an upper side of FIG. 11A, of the multilayer board 123; namely, a side of the multilayer board 123 on which an IC chip 125 is to be mounted. A plurality of terminal members 129 are provided on the other main principal surface side (a second principal surface), shown as a lower portion of FIG. 11A.

More specifically, the multilayer board 123 is built by putting a wire layered block 131 and a solder resist layer 133 one on top of the other. Of the multilayer board, the wire layered block 131 is formed by putting a plurality of resin insulation layers 135 one after another and forming conductor layers 137 and via conductors 139 in a stacked manner within the layered resin insulation layers 135. Further, the solder bumps 127 on the first principal surface side of the multilayer board 123 and the terminal members 129 on the second principal surface side of the multilayer board 123 are electrically connected together by means of the conductor layers 137 and the via conductors 139.

Figure 11B:
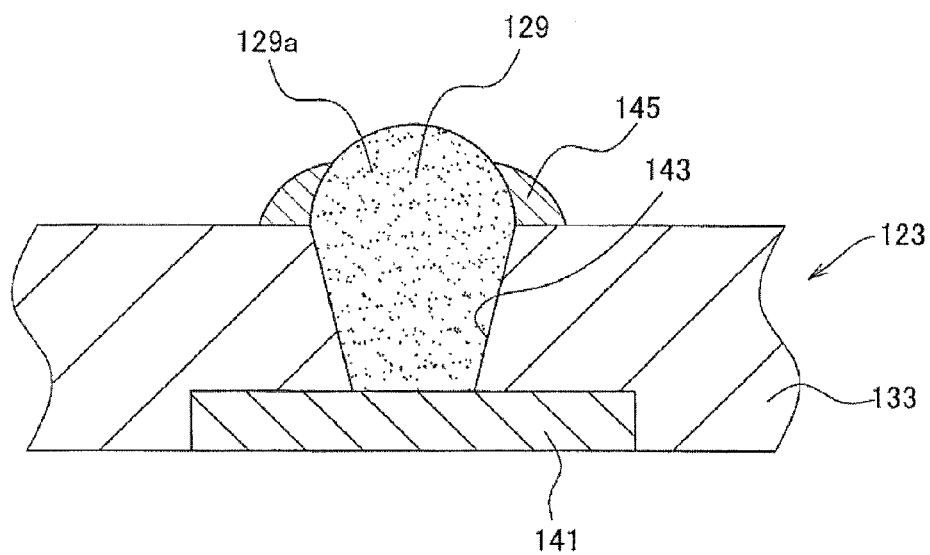
FIG. 11B is a cross sectional view showing a general configuration of a neighborhood of an embodied terminal member while the terminal member is broken in its thicknesswise direction, wherein a mother board side of the terminal member is upwardly oriented.

Particularly, in the present embodiment, as shown in FIG. 11B, a circular terminal opening 143 that spreads upwardly in the drawing is formed at a center of an upper surface of each terminal pad 141 in the solder resist layer 133 covering the second principal surface side, shown as an upper side in FIG. 11B. The terminal member 129 is put, in a bonded manner, within each terminal opening 143 so as to fill the terminal opening 143.

The entirety of each terminal member 129 is made of solder, and an extremity of the terminal member 129 juts outside, specifically outside with reference to the surface of the multilayer board, of the corresponding terminal opening 143 in a substantially hemispherical or dome shape.

Moreover, of a projection 129a jutting out of a surface of the board of the terminal member 129, a portion facing the multilayer board 123 is covered with an electric insulation surface layer 145 similar to that described in connection with the first embodiment. More specifically, the projection 129a is closely covered with the electric insulation surface layer 145 leaving no space between them, in such a way that a surface of a root, except an upper extremity, of the projection 129a does not become exposed outside.

A method for manufacturing the wiring board 121 of the present embodiment is now described.

Since processes pertaining to manufacturing a multilayer board and forming solder bumps are analogous to those described in connection with the first embodiment, their descriptions are omitted. Explanations are hereunder given for processing pertaining to a process forming a terminal member that is a characteristic portion of the present embodiment.

As shown in FIG. 11A, a solder print mask (not shown) is put on the second principal surface side of the multilayer board 123 manufactured under a manufacturing method analogous to that described in connection with the first embodiment. A print opening having a shape (e.g., disc shape) similar to a planar shape of each BGA terminal pad 141 is formed at a position on the solder print mask that corresponds to one BGA terminal pad 141.

Next, printing is carried out by use of the solder print mask and a bonding material that is a print material that has a composition similar to that described in connection with the first embodiment, but that is not illustrated. The terminal openings 143 are thereby filled with an amount of bonding material paste enough to form the terminal members 129 by means of printing, thereby letting the bonding material paste further rise outwardly from the surface of the board.

Next, the bonding material paste is heated and subsequently cooled, thereby solidifying only the solder. Thus, the electric insulation surface layer 145 as well as the terminal members 129 are formed.

Specifically, an epoxy resin in the bonding material paste becomes softened upon being heated to a temperature that is higher than the glass transition point. When the epoxy resin is further heated, the solder becomes fused. The thus-fused solder juts out of the surface of the board in a dome shape by virtue of surface tension. A part of the surface, such as an outer periphery of a root, of the solder jutting in a dome shape is therewith covered with the thus-solidified epoxy resin.

When the temperature of the epoxy resin increases further, the epoxy resin becomes solidified in this state, to thus form the electric insulation surface layer 145. When the temperature is decreased to a room temperature, an extremity of the solder becomes solidified while jutting outside in a dome shape, to thus form the terminal member 129.

There is thereby obtained a junction structure in which the surface, except the extremity, of the projection 129a of each terminal member 129 is covered with the electric insulation surface layer 145.

In the present embodiment, the extremity of the projection 129a is not covered with the electric insulation surface layer 145. This can be accomplished by controlling the amount of bonding material paste and the ratio of solder to epoxy resin, in consideration of the size of the terminal opening 143 on the corresponding BGA terminal pad 141 and the size of the terminal member 129.

The present embodiment yields an advantage similar to that yielded in the first embodiment. In addition, the terminal member 129 is formed not from a terminal pin but by fusing and solidifying solder. Hence, operation for bonding the terminal pins upright becomes obviated, whereby an advantage of further facilitation of the manufacturing method is yielded.

The extremity of the projection 129a of the terminal member 129 is not covered with the electric insulation surface layer 145. Aside from this, however, the entire surface of the projection 129a of each terminal member 129 can also be covered with the electric insulation layer 145. Subsequently, the electric insulation surface layer 145 can be removed from the extremity by means of; for instance, abrasion, or the like.

The present invention is not limited to the above-discussed embodiments, and can assume various forms so long as the forms belong to the technical scope of the present invention.

For example, even when solder resist exists or does not exist on the surface of the wiring board, the present invention can be adopted.

The first through third embodiments have described a wiring board having solder bumps, CPs, and stiffeners. Embodiments of the present invention can also apply to a wiring board not including solder bumps or stiffeners.

Figure 12:
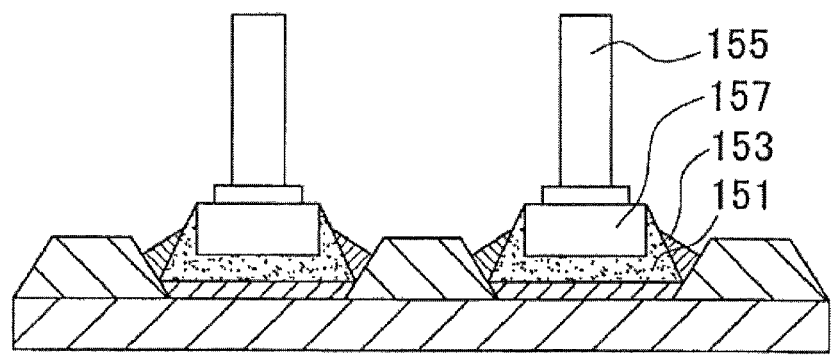
FIG. 12 is an explanatory view showing embodied terminal pins bonded to an electronic component mount wiring board while the wiring board is broken in its thicknesswise direction.

Further, in the first and second embodiments, the entire surface of each of the solder junctions is covered with the electric insulation surface layer. However, as shown in FIG. 12, a surface of each solder junction 151 can also be partially covered with an electric insulation surface layer 153. Specifically, each solder junction 151 located around an outer periphery of a bottom portion 157 of each terminal pin 155, except the surface of the solder junction 151, can also be covered with the electric insulation surface layer 153. This also yields an advantage, such as an electric insulation property, depending in part on the size of the electric insulation surface layer 153.

Embodiments of the present invention show that an advantage similar to those yielded in the above-discussed embodiments can also be yielded even when solder assumes the lower limit value (e.g., the solder accounts for 50 percent by weight, and the electric insulation material accounts for 50 percent by weight) and the upper limit value (e.g., the solder accounts for 95 percent by weight, and the electric insulation material accounts for 5 percent by weight) within a numerical range of components of the bonding material.

What is claimed is:

1. A wiring board comprising:
    terminal members put on terminal pads of a multilayer board made by alternately stacking one or more conductor layers and one or more resin insulation layers, wherein a solder resist layer configured to cover the multilayer board is formed on a surface, on which the terminal pads are formed, of the multilayer board, the solder resist layer is provided with terminal openings at positions corresponding to the terminal pads, and each of the terminal members is a pin member including a base whose bottom surface is bonded to each of the terminal pads inside the terminal openings by way of solder and a pin that stands upright on a top surface of the base; and
    an electric insulation surface layer made of an electric insulation material formed over an exposed surface of the solder to which the base is bonded, wherein the solder is bonded to the bottom surface of each of the bases and the solder is not bonded to the top surface of each of the bases, the electric insulation surface layer is not bonded to the top surface of each of the bases, and the electric insulation surface layer is not bonded to an area of the solder resist layer between the terminal openings.

* * * * *